US012732206B1

(12) United States Patent
Zamanlooy et al.

(10) Patent No.: US 12,732,206 B1
(45) Date of Patent: Sep. 8, 2026

(54) ASYNCHRONOUS SAR ADC WITH DETECTION AND CORRECTION CIRCUIT FOR LARGE AMPLITUDE OUTPUT CODE ERRORS

(71) Applicant: Synopsys, Inc., Sunnyvale, CA (US)

(72) Inventors: Babak Zamanlooy, Richmond Hill (CA); Marc-Andre Lacroix, Ottawa (CA)

(73) Assignee: Synopsys, Inc., Sunnyvale, CA (US)

( * ) Notice: Subject to any disclaimer, the term of this patent is extended or adjusted under 35 U.S.C. 154(b) by 104 days.

(21) Appl. No.: 18/940,690

(22) Filed: Nov. 7, 2024

(51) Int. Cl.
*H03M 1/46* (2006.01)

(52) U.S. Cl.
CPC .................................. *H03M 1/462* (2013.01)

(58) Field of Classification Search
CPC ................................ H03M 1/46; H03M 1/462
See application file for complete search history.

(56) References Cited

U.S. PATENT DOCUMENTS 6,490,332 B1 * 12/2002 Somayajula ........... G11C 19/28 377/80
8,957,802 B1 * 2/2015 Evans ................. H03M 1/0863 341/161
9,306,609 B1 * 4/2016 LaCroix ................. H04B 3/548
9,362,939 B1 * 6/2016 Rath ..................... H03M 1/145
9,397,623 B1 * 7/2016 Lacroix .............. H03F 3/45197
9,484,945 B1 * 11/2016 Wan .................... H03M 1/0863
9,553,600 B1 * 1/2017 Lacroix ............... H03M 1/0624
9,871,529 B1 * 1/2018 Chong .................. H03M 1/121
10,009,035 B1 * 6/2018 LaCroix ................ H03M 1/007
10,044,364 B1 * 8/2018 Sharif ................... H03M 1/468
10,103,743 B1 * 10/2018 Wang .................... H03M 1/007
10,461,767 B1 * 10/2019 Farid ..................... H03M 1/462
10,523,341 B1 * 12/2019 Krotnev ................. H04B 15/00
10,693,486 B1 * 6/2020 Ko ....................... H03K 5/2481
10,749,663 B1 * 8/2020 Lacroix ............... H03F 3/45475
10,938,399 B1 * 3/2021 Chao ................... H03M 1/0695
(Continued)

OTHER PUBLICATIONS

Bankman D., et al., "Understanding Metastability in SAR ADCs, Part I: Synchronous," Spring, 2019, pp. 86-97.
(Continued)

*Primary Examiner* — Lam T Mai
(74) *Attorney, Agent, or Firm* — Weaver Austin Villeneuve & Sampson LLP

(57) ABSTRACT

An N-bit successive SAR includes, in part, a differential comparator receiving a pair of differential input signals and generating a pair of differential comparator output signals; an N-bit register storing the comparator output signals; a capacitive DAC supplying differential feedback signals to the differential comparator in response to the register; and M detection circuits each associated with one of M most significant bits of the N-bit register. Each detection circuit includes: a PMOS transistor precharging a first node to a supply voltage; a first NMOS transistor having a drain coupled to the first node, and a gate receiving a first voltage representative of one of the differential feedback signals; a second NMOS transistor having a drain coupled to a source of the first NMOS transistor, a gate receiving a second voltage representative of the other one of the differential feedback signals, and a source coupled to a ground terminal.

20 Claims, 15 Drawing Sheets

(56) References Cited

U.S. PATENT DOCUMENTS

| | | | | |
|---|---|---|---|---|
| 11,133,812 | B1 * | 9/2021 | Lebedev | H03M 1/40 |
| 12,556,173 | B2 * | 2/2026 | Lebedev | H03K 5/249 |
| 2005/0200510 | A1 * | 9/2005 | Yoshida | H03M 1/1245 341/155 |
| 2006/0232461 | A1 * | 10/2006 | Felder | H03M 1/462 341/161 |
| 2010/0079319 | A1 * | 4/2010 | Berens | H03M 1/1038 341/120 |
| 2011/0260899 | A1 * | 10/2011 | Snedeker | H03M 1/1047 341/118 |
| 2013/0088375 | A1 * | 4/2013 | Wu | H03M 1/1052 341/120 |
| 2014/0091960 | A1 * | 4/2014 | Cowley | H03M 1/38 341/172 |
| 2016/0254821 | A1 * | 9/2016 | Luo | H03K 5/2481 341/161 |
| 2019/0028236 | A1 * | 1/2019 | Tonietto | H04L 1/0009 |
| 2019/0097646 | A1 * | 3/2019 | Chuang | H03M 1/468 |
| 2020/0151076 | A1 * | 5/2020 | Lacroix | G06F 11/263 |
| 2020/0220553 | A1 * | 7/2020 | Zabroda | H03M 1/462 |
| 2020/0366309 | A1 * | 11/2020 | Zabroda | H03M 1/466 |
| 2021/0234548 | A1 * | 7/2021 | Tangirala | H03M 1/468 |
| 2024/0137036 | A1 * | 4/2024 | Chao | H03M 1/466 |
| 2025/0038757 | A1 * | 1/2025 | Kijima | H03M 1/462 |
| 2025/0365004 | A1 * | 11/2025 | Shen | H03M 3/04 |

OTHER PUBLICATIONS

Cho S., et al., "A Two-Channel Asynchronous SAR ADC With Metastable-Then-Set Algorithm," IEEE Transactions on Very Large Scale Integration (VLSI) Systems, 2012, vol. 20 (4), pp. 765-769.

Chung Y., et al., "A PVT-Tracking Metastability Detector for Asynchronous ADCs," Department of Electronic and Computer Engineering, 2016, pp. 1462-1465.

Osipov D., "Method to Reduce the Number of Metastability Errors in Asynchronous SAR ADCs, " IEEE Transactions on Circuits and Systems-II: Express Briefs, 2023, vol. 70 (8), pp. 2739-2743.

Shahi S.N., et al., "The Problem of Comparator Metastability in High-speed Wireline Receivers," DesignCon, 2019, pp. 1-20.

Vitek R., et al., "A 0.015mm2 63fJ/conversion-step 10-Bit 220MS/s SAR ADC With 1.5b/step Redundancy and Digital Metastability Correction," IEEE, 2012, pp. 1-4.

Yang X., et al., "A Metastability Error Detection and Reduction Technique for Partially Active Flash ADCs," IEEE Transactions on Circuits and Systems-II: Express Briefs, 2016, vol. 63 (4), pp. 331-335.

Yu A., et al., Understanding Metastability in SAR ADCs, Part II: Asynchronous, 2019, pp. 16-32.

Zhang L., et al., "Background Calibration in Pipelined SAR ADCs Exploiting PVT-Tracking Metastability Detector," IEEE International Symposium on Circuits and Systems, 2021, pp. 1-5.

* cited by examiner

| MF6 | MF5 | MF4 | MF3 | MF2 | SAR Corrected Output | Initial Error | Expected Error |
|---|---|---|---|---|---|---|---|
| 0 | 0 | 0 | 0 | 0 | $b_6b_5b_4b_3b_2b_1b_0$ | 0 | 0 |
| 1 | X | X | X | X | 100000 | 32 | 1 |
| 0 | 1 | X | X | X | $b_6$100000 | 16 | 1 |
| 0 | 0 | 1 | X | X | $b_6b_5$10000 | 8 | 1 |
| 0 | 0 | 0 | 1 | X | $b_6b_5b_7$1000 | 4 | 1 |
| 0 | 0 | 0 | 0 | 1 | $b_6b_5b_4b_3$100 | 2 | 1 |

ASYNCHRONOUS SAR ADC WITH DETECTION AND CORRECTION CIRCUIT FOR LARGE AMPLITUDE OUTPUT CODE ERRORS

TECHNICAL FIELD

The present application relates to an asynchronous successive approximation register analog-to-digital converter (ADC), and more particularly to an asynchronous successive approximation register ADC adapted to detect and correct metastability induced output code errors.

BACKGROUND

Analog-to-digital converters (ADC) are widely used in electronic systems, such as broadband communication systems, audio systems, and receiver systems to convert analog signals to digital signals. An ADC may be implemented by an asynchronous successive-approximation-register (SAR) to achieve analog-to-digital signal conversion during a multitude of clock cycles. An asynchronous SAR ADC may also be used in high-speed Serializer-Deserializer (SerDes) circuitry.

BRIEF DESCRIPTION OF THE DRA WINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to detecting and correcting metastability induced code error at the output of an asynchronous SAR.

In wireline systems, conversion of an analog signal to a digital signal is typically carried out using an asynchronous SAR analog-to-digital converter (ADC). The bit error rate (BER) of an asynchronous SAR is typically required to be lower than, for example $1e^{-10}$, in order to comply with applicable protocols. One source of BER degradation in an asynchronous SAR ADC is the metastability in the comparator disposed in the asynchronous SAR ADC.

When the input voltage to such a comparator is relatively small, the relatively long time that it can take for the comparator to resolve the input voltage may induce metastability in the comparator. Comparator metastability may result in large code errors by two mechanisms. In the first mechanism, while the comparator is in a metastable state, the circuits responsive to the output of the comparator remain in valid states. Moreover, the SAR ADC (alternatively referred to herein as SAR) conversion will not continue until metastability is resolved. In the second mechanism, metastability of the comparator causes systems responsive to the comparator to enter invalid states. However, in this case, the SAR conversion is not gated and thus continues even though there is an invalid state condition. Large errors caused by the first mechanism can be avoided by using the asynchronous architecture without the need to have metastability detection and correction. However, large code errors caused by the second mechanism can limit the wireline system BER even with the asynchronous architecture. For example, for a 7-bit SAR, the metastability may cause a 32 least significant bit (LSB) error, thus exceeding the required error rate in a wireline system. As is described further below in detail, a system and method, in accordance with embodiments of the present disclosure detect and correct metastate induced SAR code errors caused by the second mechanism.

Figure 1:
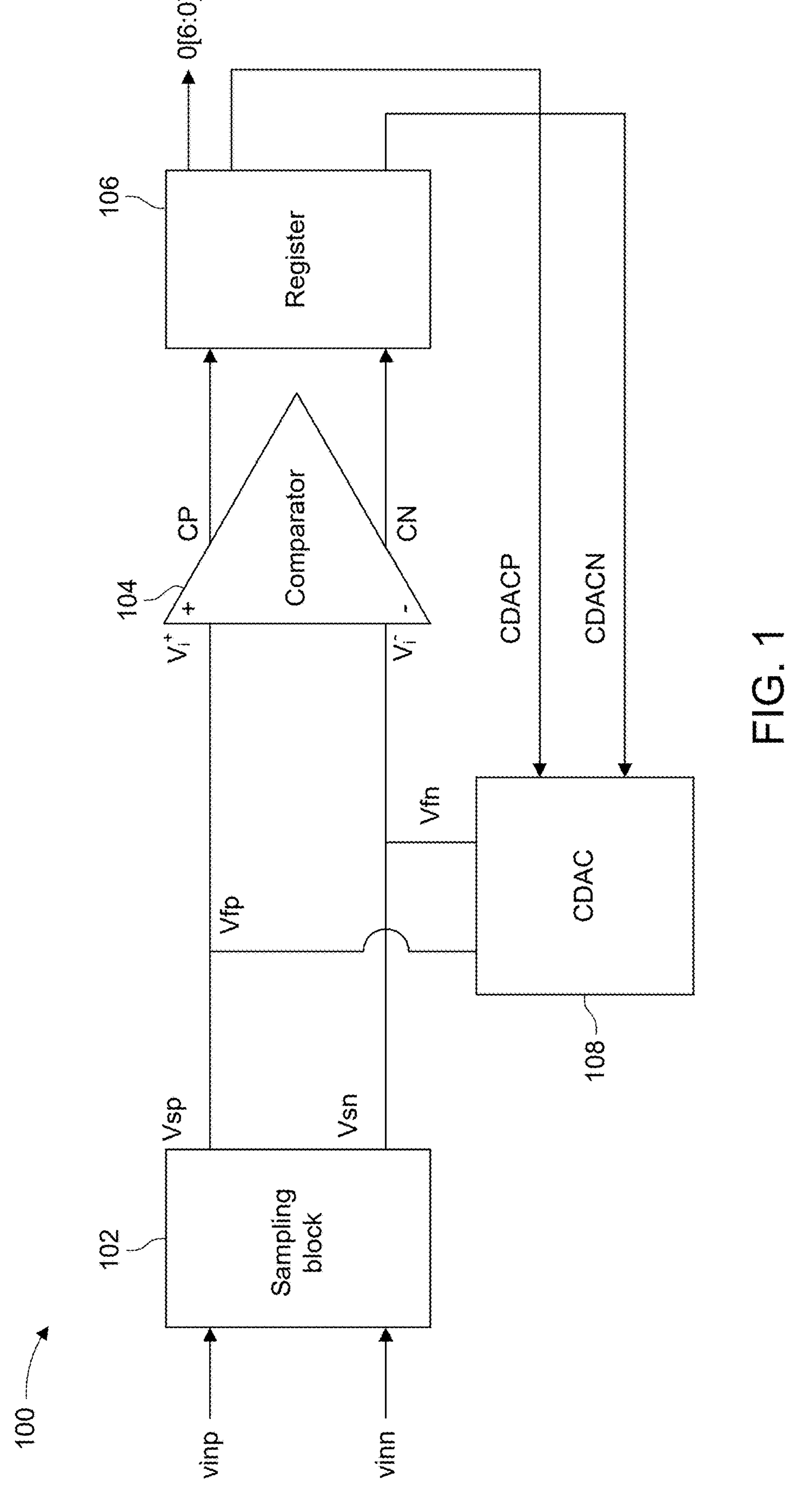
FIG. 1 is a block diagram of an asynchronous SAR.

FIG. 1 is a block diagram of a 7-bit SAR 100. SAR 100 is shown as including, in part, a differential sampling block 102, a comparator 104, a multi-bit register 106, and a capacitor digital to analog converter (CDAC) 108. Differential sampling block 102 receives and samples the differentially positive input signal vinp and the differentially negative input signal vinn and supplies the sampled signals as differential output signals Vsp and Vsn.

Signals Vsp and Vsn, together with feedback signals Vfp and Vfn described further below, result in the application of differential signals $Vi^+$ and $Vi^-$ at the input terminals of comparator 104. In response, comparator 104 generates a pair of differential signals CP and CN. For example, if $Vi^+$ is larger than $Vi^-$, then signals CP and CN are respectively set to logic 1 and 0. Conversely, if $Vi^+$ is smaller than $Vi^-$, then signals CP and CN are respectively set to logic 0 and 1. Signals CP and CN are stored in 7-bit register 106 during each of the 7 cycles of the SAR and fed back to the comparator via CDAC 108. After 7 conversion cycles described further below, the 7-bit output signal O[6:0] of register 106 represents the signal converted by SAR 100. It is understood that the 7-bit register 106 stores each of the signals CP and CN in a different flip-flop disposed in the register.

Figure 2:
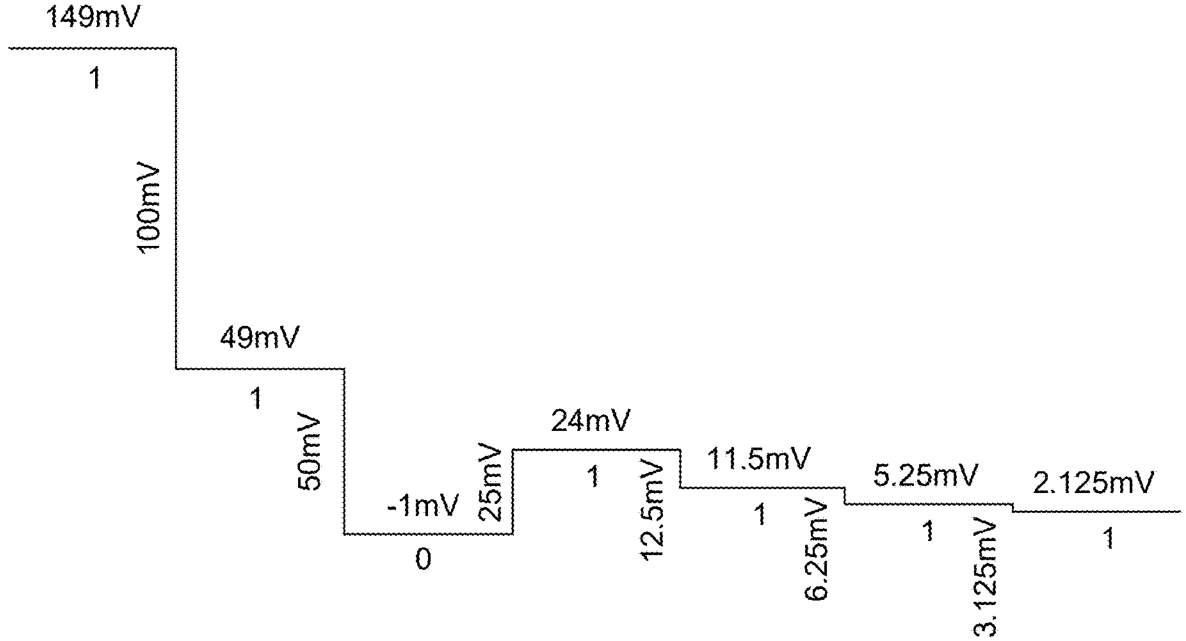
FIG. 2 shows an example of the output of SAR of FIG. 1 in response to a received input voltage.

FIG. 2 shows an example of the output of the SAR of FIG. 1. The values shown above the horizontal steps represent the voltages at the input terminals of the comparator during each of the 7 successive cycles of the conversion. The values shown below the horizontal steps represent the register bits set during each associated conversion cycle, and the values shown next to the vertical lines represent the voltages supplied by CDAC 108 via differential signals Vfp and Vfn.

Assume SAR 100 is adapted to operate between +200 millivolts (mv) and −200 mv, and the differential voltage at the input of comparator 102 is 149 mv. Because the input to the comparator is greater than 0 volt, the most significant bit (MSB) of register 106 is set to 1 during the first cycle of the signal conversion. This register value is applied as a pair of differential feedback signals CDACP and CDACN to CDAC 108, which in response increases or decreases the voltage received at the input terminals of comparator 104 via signals Vfp and Vfn.

In this example, the largest voltage step that the CDAC can supply at its differential outputs Vfp and Vfn in response to signals CDACP and CDAN is 100 mv. Accordingly, the differential voltages $Vi^+$ and $Vi^-$ received at the input terminals of the comparator 104 are reduced to 49 mv (149 mv-100 mv). Because 49 mv is greater than 0 volt, the second MSB of 7-bit register 106 is also set to 1, thus causing CDAC 108 to generate a differential voltage of 50 mv between signals Vfp and Vfn, in turn causing the differential voltages $Vi^+$ and $Vi^-$ received at the input terminals of the comparator 104 to be reduced to −1 mv (49 mv-50 mv).

With each successive cycle through the CDAC feedback loop during the signal conversion process, the voltage between signals Vfp and Vfn is reduced by a factor of 2 such that, for example, during the third and fourth steps through the loop the voltage between signals Vfp and Vfn is respectively reduced by 25 mv and 12.5 mv. After seven conversion cycles, the seven bits of signal O[0:6] are set to a value representative of the differential signals Vinp and Vinn.

Figure 3:
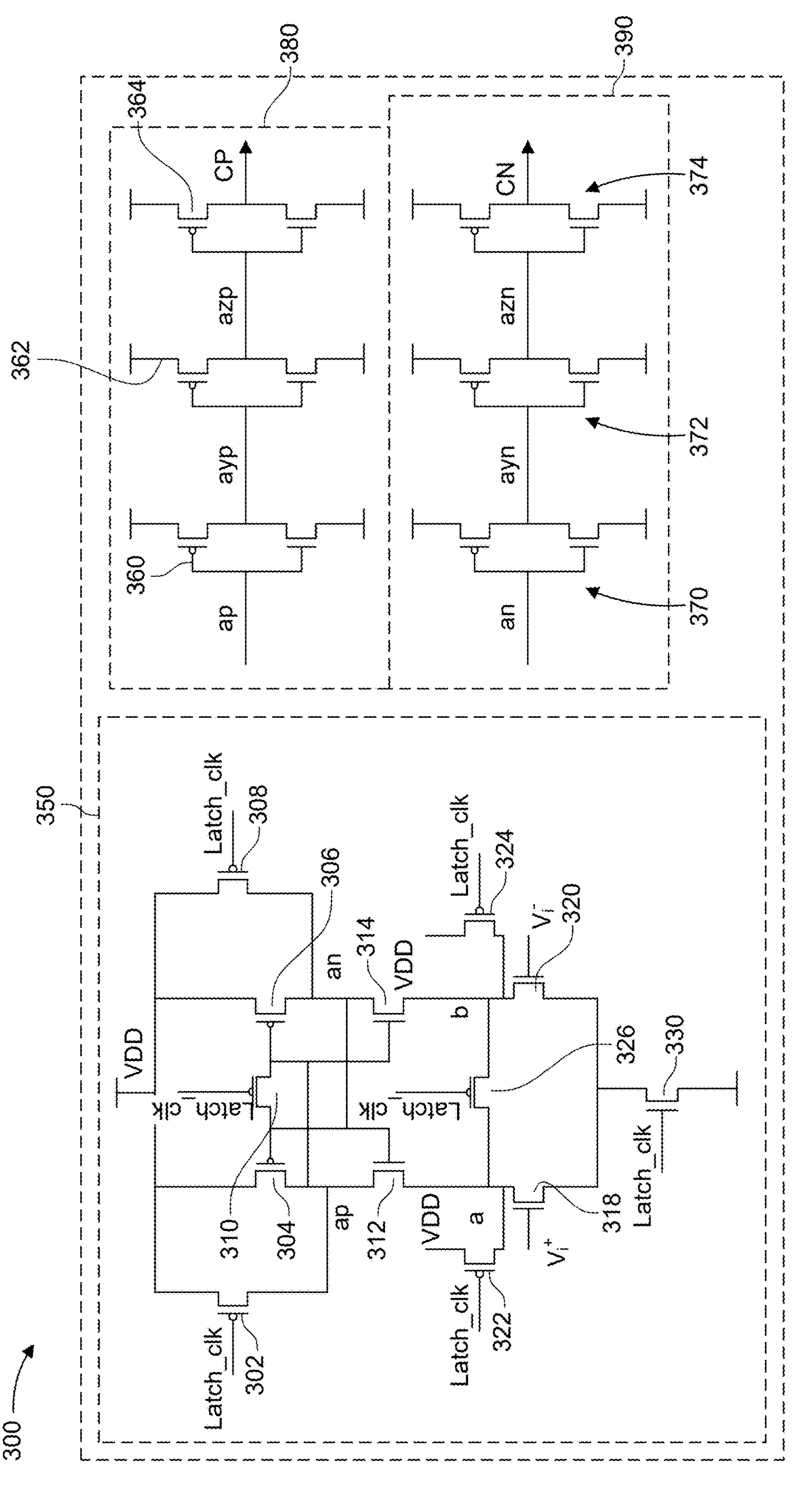
FIG. 3 is a transistor-level schematic diagram of the comparator disposed in the SAR of FIG. 1.

FIG. 3 is a transistor-level schematic diagram of comparator 104 shown in FIG. 1. Comparator 104 includes a latch 350, a first chain of inverters 380, and a second chain of inverters 390. Latch 350 includes p-channel metal-oxide semiconductor (PMOS) transistors 302, 304, 306, 308, 310, 322, 324, and 326, and n-channel metal-oxide semiconductor (NMOS) transistors 312, 314, 318, 320, and 330.

When signal latch_clk is set to a relatively low voltage (logic low value) transistors 302, 308, 310, 322, 324 and 326 turn on to precharge nodes a, b, ap, and an to the supply voltage VDD. Signal latch_clk is then set to a high voltage level to turn off transistors 302, 308, 310, 322, 324 and 326. Thereafter, if signal $Vi^+$ applied to the gate of NMOS transistor 318 is greater than signal $Vi^-$ applied to the gate of NMOS transistor 320, output node ap is pulled to the ground voltage via transistors 312, 318 and 330 while output node an remains at the VDD voltage level. This causes the latch formed by transistor 304, 306, 312 and 314 to maintain node an at the VDD supply voltage, and node ap at the ground voltage level. The driving capability of the voltage at node ap is boosted by inverter chain 380 which generates the first comparator output voltage at node CP. Inverter chain 380 also isolates node ap from node CP. The driving capability of the voltage at node an is boosted by the inverter chain 390 which generates the second comparator output voltage at node CN. Inverter chain 390 also isolates node an from node CN.

Conversely, if signal $Vi^+$ applied to the gate of NMOS transistor 318 is smaller than signal $Vi^-$ applied to the gate of NMOS transistor 320, output node an is pulled to the ground voltage via transistors 314, 320 and 330 while node ap remains at the VDD voltage level. This causes the latch formed by transistor 304, 306, 312 and 314 to maintain node ap at the VDD supply voltage level, and node an at the ground voltage level.

Figure 4:
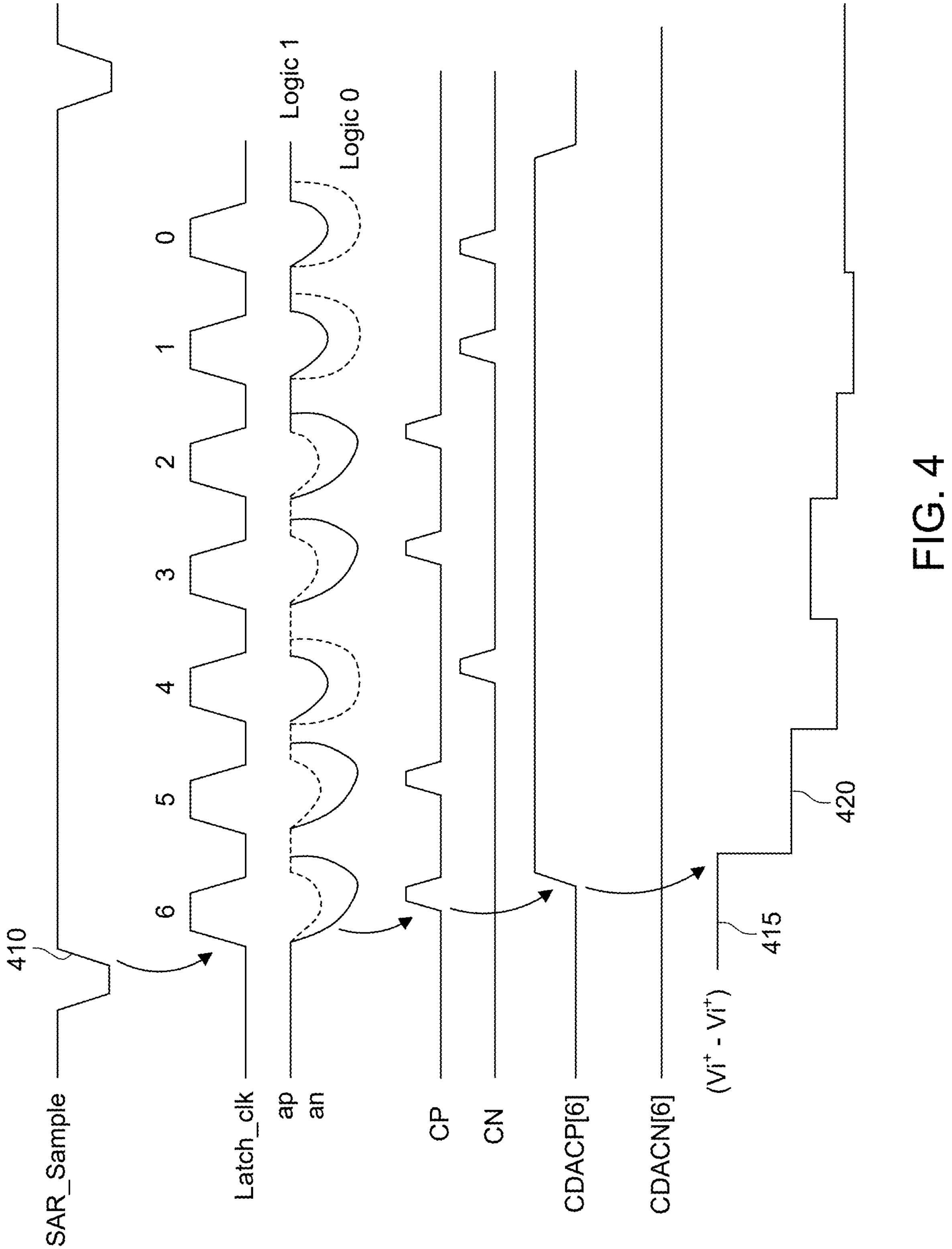
FIG. 4 is an example of the timing diagram of various signals associated with the SAR of FIG. 1 in the absence of metastability.

FIG. 4 is an example of the timing diagram of the various signals associated with SAR 100 of FIG. 1 in the absence of metastability. Referring to FIGS. 1, 3, and 4 concurrently, voltages Vinp and Vinn received by sampling block 102 are sampled on the rising edge 410 of signal SAR_Sample. Signal latch_clk operates as the clock signal to the comparator and initializes the comparator latch 350 for the comparison operation. Signals ap (shown in solid line) and an (shown in dash line) are the differential output signals of comparator latch 350 and are determined after signal latch_clk is set to a high logic level. Signals CP and CN are the outputs of inverter chains 380 and 390 respectively. As was described above signal CP is the inverse of signal ap, and signal CN is the inverse of signal an in this example. Signals CDACN[6] and CDACP[6] respectively represent bit 6 of signals CDACN and CDACP applied to CDAC 108.

In the example shown in FIG. 4, during any of the seven signal conversion cycles, one of the two outputs (e.g., ap or an) of the comparator is set to a logic 1 level, whereas the other one of the outputs (e.g., an or ap) is set to a logic 0 level. For example, during cycle 6, when signal ap is detected as being at logic 0 and signal an is detected as being at logic 1, signal CP is at logic 1 and signal CN is at logic 0. This causes bit 6 of CDACP, namely CDACP[6] to be at a logic 1 and bit 6 of CDACN, namely CDACN[6] to be at a logic 0, in turn causing the output ($Vi^+$−$Vi^+$) of CDAC 108 to drop in voltage from the initial level at 415 to the level 420 as expected. In FIG. 2, this voltage drop is shown as being 100 mv.

Figure 5:
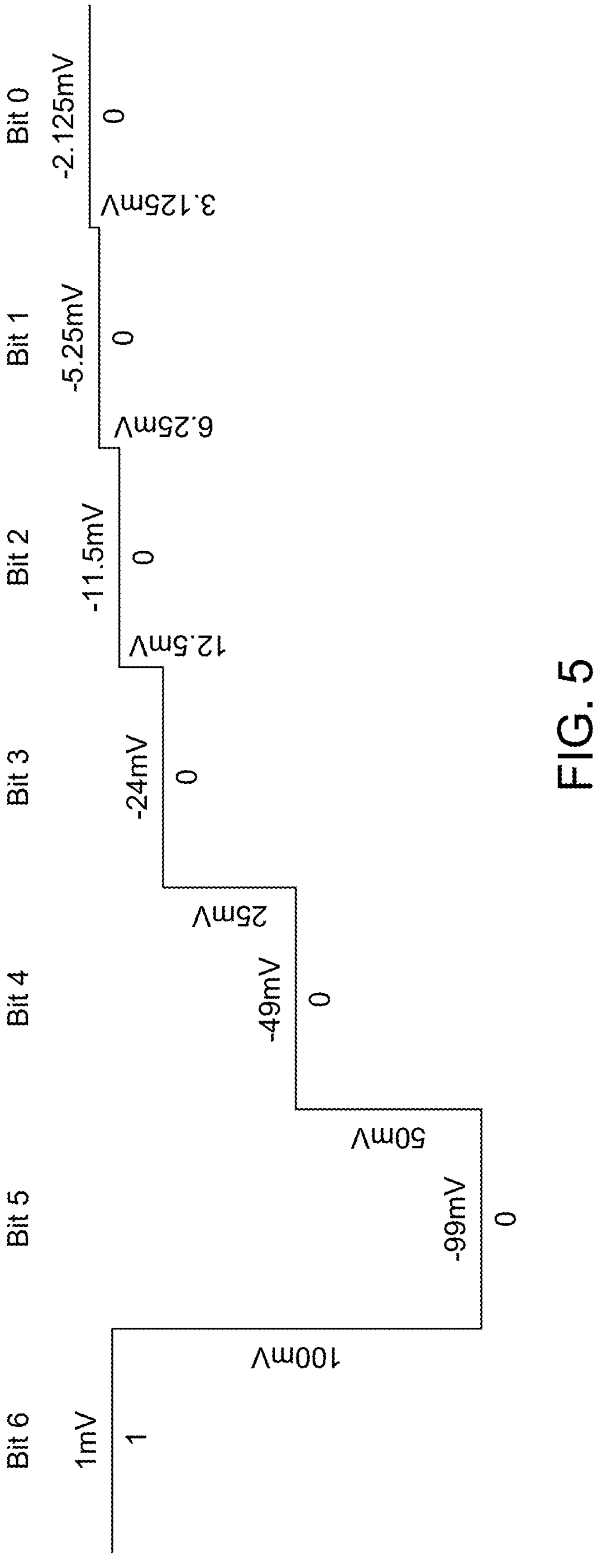
FIG. 5 shows more details of the output of SAR of FIG. 1 associated with the waveforms shown in FIG. 4.

FIG. 5 shows more details of the 7-bit output of SAR 100 of FIG. 1 for the waveforms shown in FIG. 4 when a differential input voltage received by the SAR is 1 mv. The values shown above the horizontal steps represent the voltages at the input terminals of the comparator during each of the 7 successive cycles of the conversion; the values shown below the horizontal steps represent the register 106 bits during each associated conversion cycle, and the values shown next to the vertical lines represent the voltages supplied by CDAC 108 via differential signals Vfp and Vfn. As is seen from FIG. 5, following the 7 conversion cycle, the output of SAR is correctly detected as 1000000.

Figure 6:
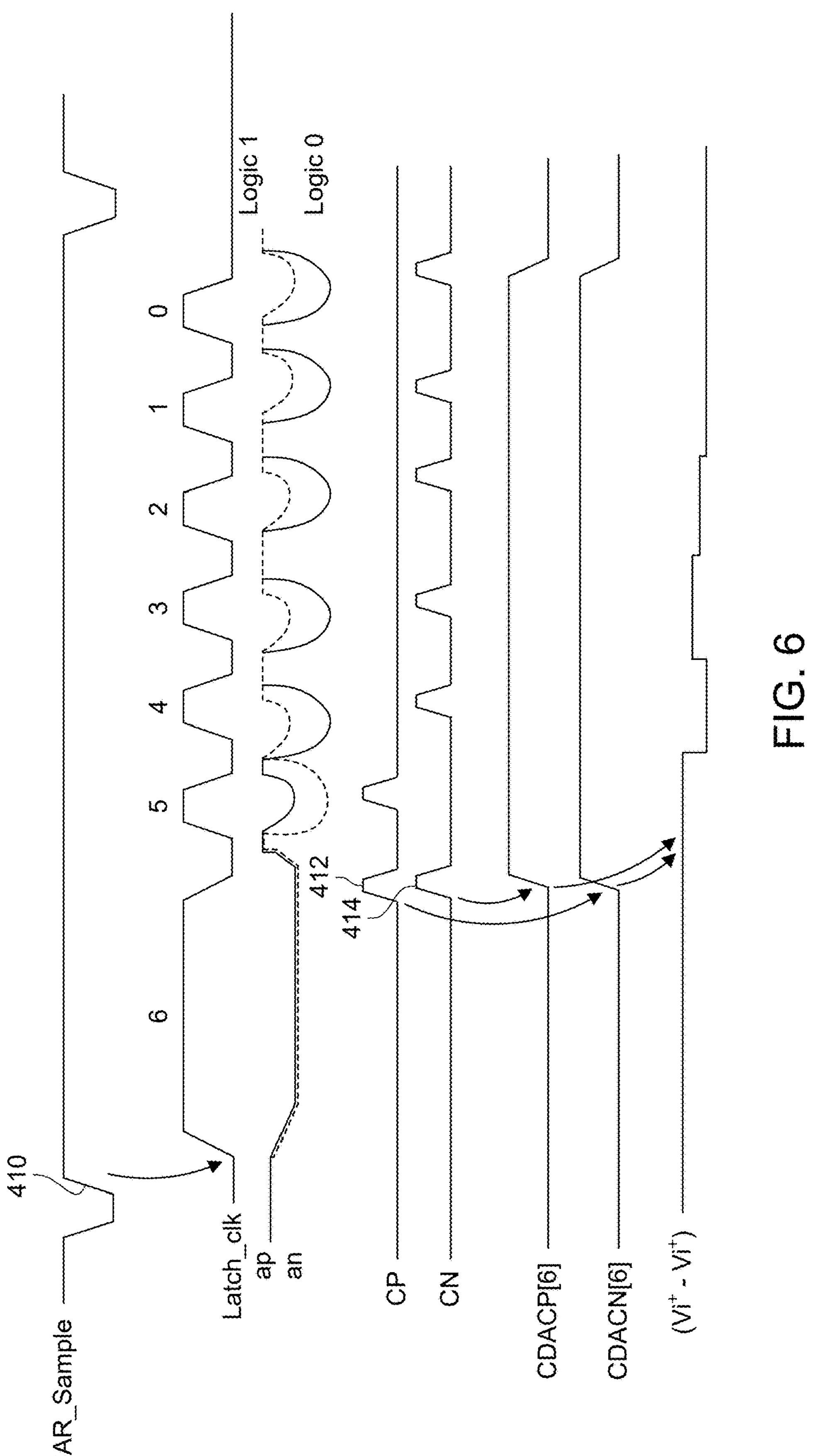
FIG. 6 is an example of the timing diagram of the various signals associated with the SAR of FIG. 1 in the presence of metastability.

FIG. 6 is an example of the timing diagram of the various signals associated with SAR 100 in the presence of metastability. Referring to FIGS. 1, 3, and 6 concurrently, voltages Vinp and Vinn received by sampling block 102 are sampled on the rising edge 410 of signal SAR_Sample.

In the example shown in FIG. 6, due to the metastability caused by the relatively small differential input voltage received by comparator latch 350, both differential outputs ap and an are detected as being low during cycle 6 of clock latch_clk. Accordingly, signals CP and CN are both detected as being positive, as shown at 412 and 414. This causes signals CDACP[6] and CDACN[6] both to have the same positive value, in turn causing the voltage difference between signals Vfp and Vfn to be 0. Because (Vfp−Vfn) is 0, no step change in the comparator input is detected thus leading to a code error at the output of the SAR.

Figure 7:
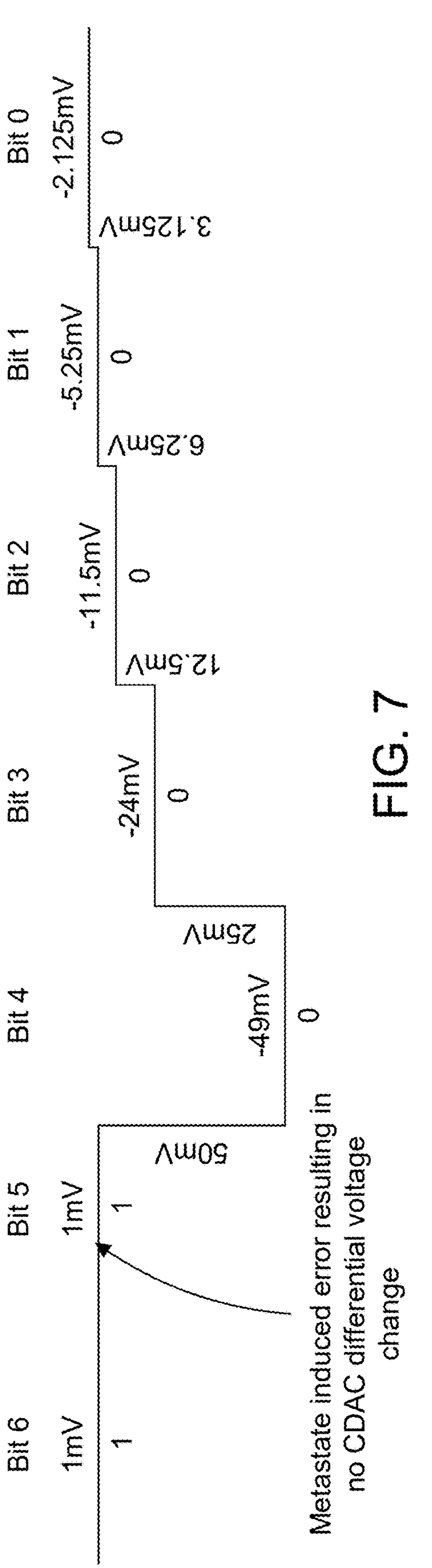
FIG. 7 shows more details of the output of SAR of FIG. 1 associated with the waveforms shown in FIG. 6.

FIG. 7 shows more details of the 7-bit output of SAR 100 of FIG. 1 for the waveforms shown in FIG. 6 when a differential input voltage received by the SAR is 1 mv. The values shown above the horizontal steps represent the voltages at the input terminals of the comparator during each of the 7 successive cycles of the conversion. The values shown below the horizontal steps represent register 106 bits during each associated conversion cycle; and the values shown next to the vertical lines represent the voltages supplied by CDAC 108 via differential signals Vfp and Vfn. Due to the metastability and failure by the comparator to generate a differential output voltage during the conversion associated with bit number 6, no step change occurs in the differential voltage received by the comparator, in turn causing bit 5 of the SAR to register a logic 1 value. The output of the SAR is therefore incorrectly detected as 1100000 (decimal value of 96) instead of 1000000 (decimal value of 64) as was described with reference to FIG. 5. This, in turn, creates a 32 LSB error.

Figure 8:
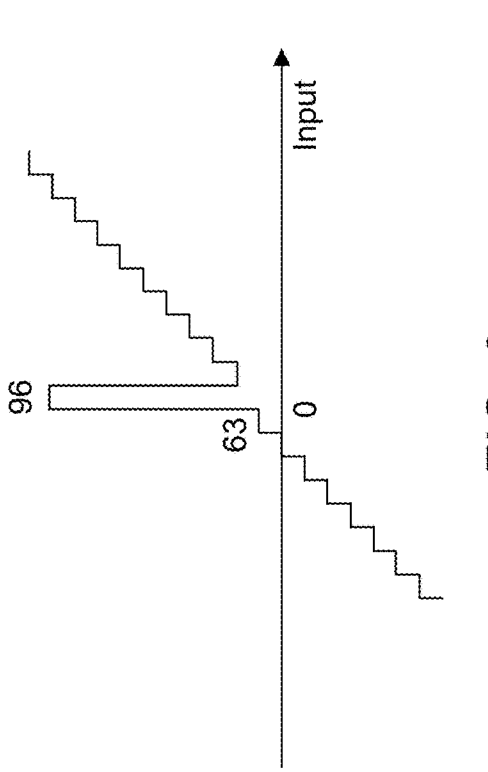
FIG. 8 shows the output code of the 7-bit SAR of FIG. 1 as a function of the input voltage received by the SAR in the presence of metastability induced error.
Figure 9:
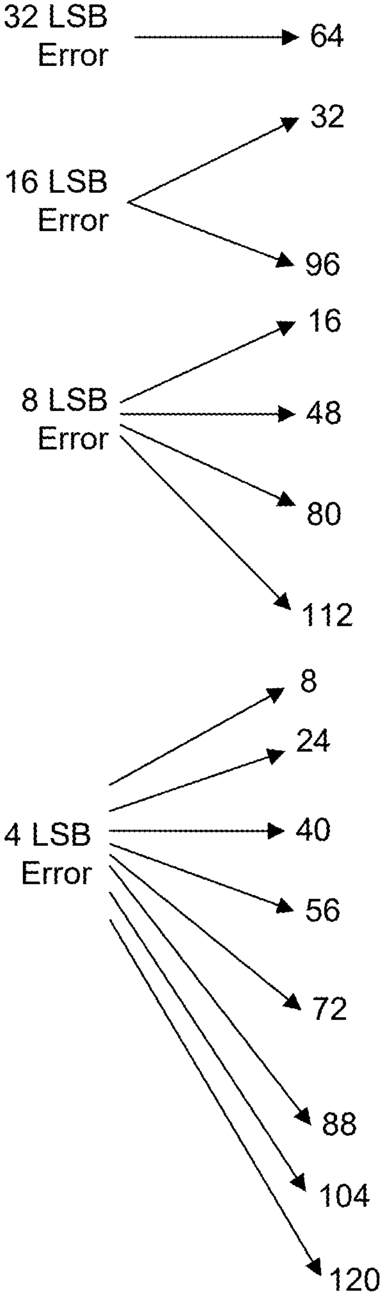
FIG. 9 shows the mapping between SAR error magnitude in terms of LSBs and the SAR output codes of FIG. 1.

FIG. 8 shows the output code of the 7-bit SAR described with reference to FIGS. 4-7 for a differential input ranging from −200 mv to 200 mv. When the differential input voltage is close to 0, the expected decimal value of the SAR is around 64, as was described above with reference to FIG. 5. However, due to the metastability, as was described above with reference to FIG. 7, the output value of the SAR is decimal 96 as shown in FIG. 8. FIG. 9 shows the mapping between errors corresponding to 32 LSB, 16 LSB, 8 LSB and 4 LSB and the output code of a 7-bit SAR. For example, a LSB error of 32 maps to an output code of 64; a LSB error of 16 maps either to an output code of 32 or 96, as shown.

Figure 10:
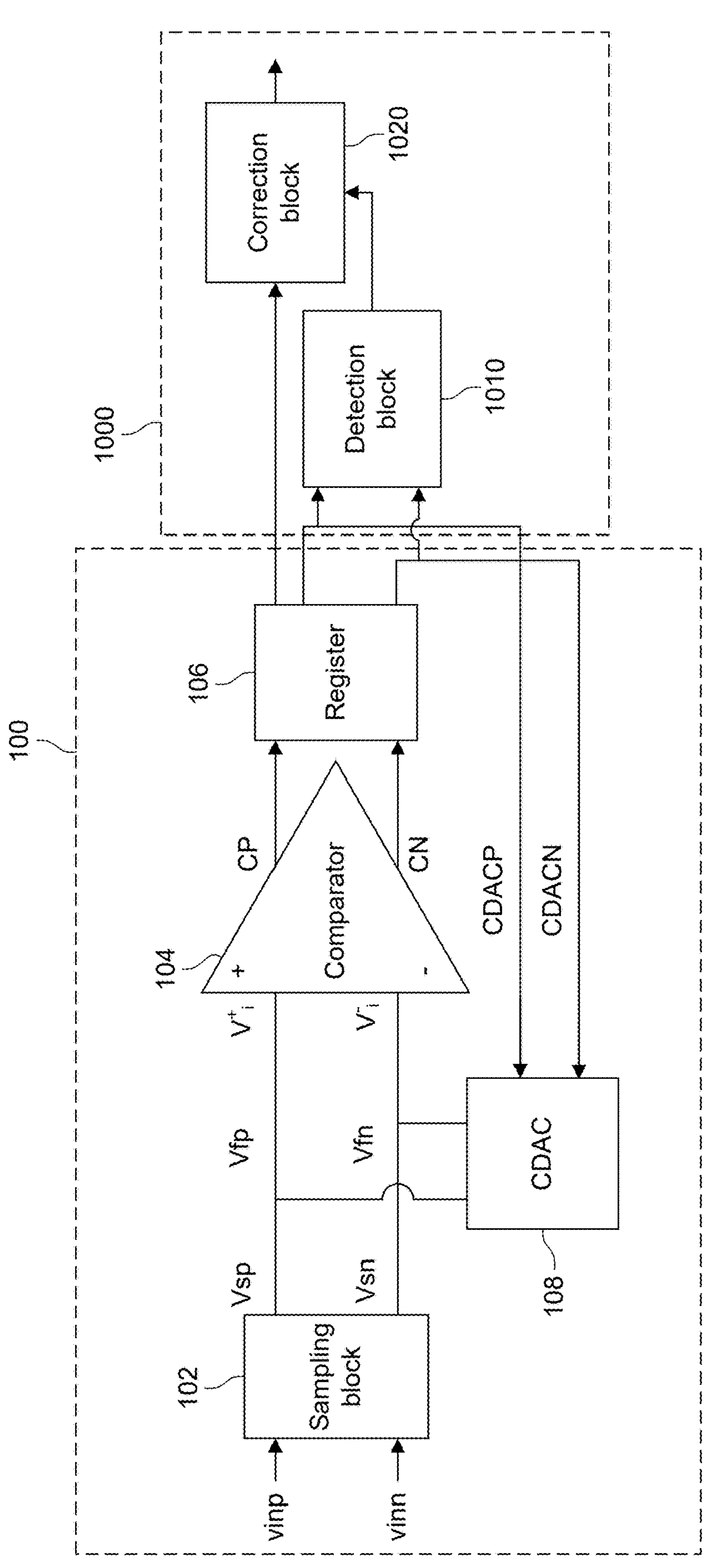
FIG. 10 is a schematic diagram of a SAR with detection and correction blocks adapted to detect and correct for metastability induced errors in the SAR, in accordance with one embodiment of the present disclosure.

Embodiments of the present disclosure overcome the above shortcoming by detecting and correcting the metastability-induced errors in a SAR. FIG. 10 shows a schematic diagram of a detection and correction block 1000 adapted to detect metastability induced errors in SAR 100 described in detail below. Detection and correction block 1000 is adapted to detect and make corrections to the output code of the SAR when errors due to metastability are induced in the SAR.

Detection and correction block 1000 includes, in part, M metastability induced error detection blocks 1010 (hereinafter alternatively referred to as detection block) each associated with a different one of M bits of an N-bit SAR 100 where M is an integer equal to or smaller than N, and a metastability induced error correction block 1020 (hereinafter alternatively referred to as correction block). For example, if the SAR is a 7-bit SAR, block 1000 may include 5 detection blocks 1010 associated with the 5 MSBs of the SAR. For simplicity and clarity, FIG. 10 shows the detection and correction block associated with only one of the SAR bits.

Detection block 1010 is adapted to receive signals CDACP and CDACN (or signals representatives of these two signals) as provided, for example, by register 106 of SAR 100 shown in FIG. 1, and generate a logic 1 if signals CDACP and CDACN both are at high levels, and generate a logic 0 if signals CDACP and CDACN are at different logic levels.

Figure 11:
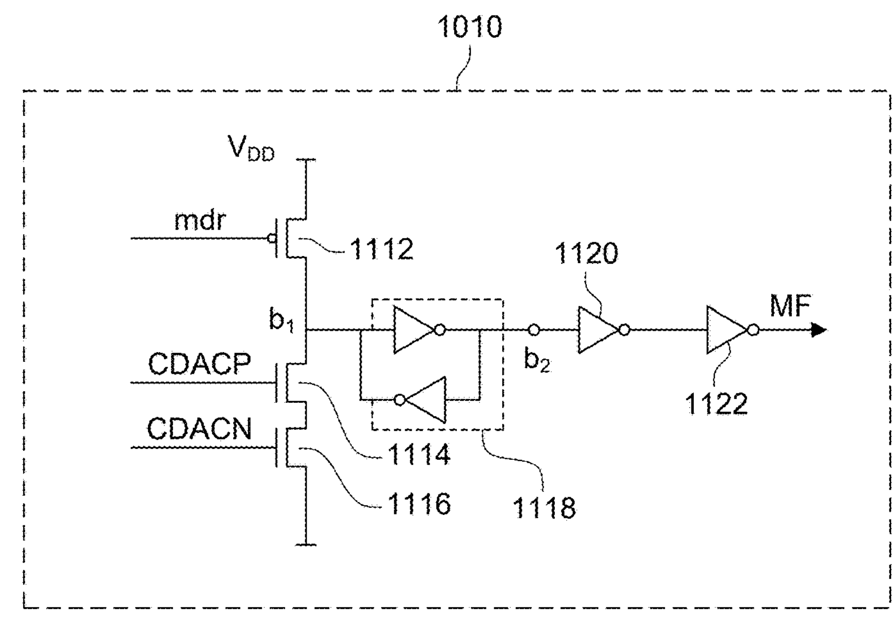
FIG. 11 is a transistor/gate level schematic diagram of a detection circuit adapted to detect an error associated with a single bit of a SAR, in accordance with one embodiment of the present disclosure.

FIG. 11 is a transistor/gate level schematic diagram of a detection circuit 1010 associated with a single bit of the SAR that is being monitored for error detection and correction. Although not shown for simplicity, it is understood that a similar circuit is used for each of the M bits of an N-bit SAR being monitored for error detection and correction, where M is an integer equal to or smaller than N.

Detection circuit 1010 is shown as including, a PMOS transistor 1112, NMOS transistors 1114, 1116, latch 1118 and inverters 1120 and 1122. In the beginning of the SAR conversion cycle, signal mdr applied to the gate of PMOS transistor 1112 is set to a low voltage (e.g., the ground potential) in order to turn PMOS transistor 1112 on and precharge node $b_1$ to the VDD supply voltage. Thereafter, transistor 1112 is turned off.

If both signals CDACP and CDACN are at high voltage levels, both NMOS transistors 1114 and 1116 are turned on thus causing node b1 to be pulled to the ground voltage, in turn causing latch 1118 to store voltage VDD at node b2. The high voltage level at node b2, in turn causes detection signal MF generated at the output of inverter 1122 to be at a high logic level (e.g., the supply voltage VDD). Conversely, if signals CDACP and CDACN are at different voltage levels (e.g., CDACP is at the VDD supply voltage and CDACN is at the ground voltage, or vice versa) then either transistor 1114 or transistor 1116 will remain off thus causing node b1 to remain at the supply voltage. This, in turn, causes the output of latch 1118 at node b2 to be at the ground potential. The ground potential at node b2, in turn causes detection signal MF to be at a low logic level (e.g., the ground voltage). In other words, if the differential outputs of the SAR comparator are both detected as being at logic high levels, then detection signal MF will be at a high logic level. If, on the other hand, the differential outputs of the SAR comparator are detected as being at differentially high and low logic levels, then the detection signal MF will be at a low logic level.

As was described above, in some embodiments, only a subset of the SAR output bits are monitored for error detection and correction. For example, in some embodiments, only the most 5 significant bits of a 7-bit SAR may be monitored in which case there are 5 error detection circuit 1100 (shown in FIG. 11) one for each bit of the 5 bits that is being monitored. Although not shown, the output signal MF of the detection circuit 1100 for bits 6-2 (the 5 most significant bits) for such an example are referred to herein as detection signals MF6, MF5, MF4, MF3 and MF2.

Figure 12:
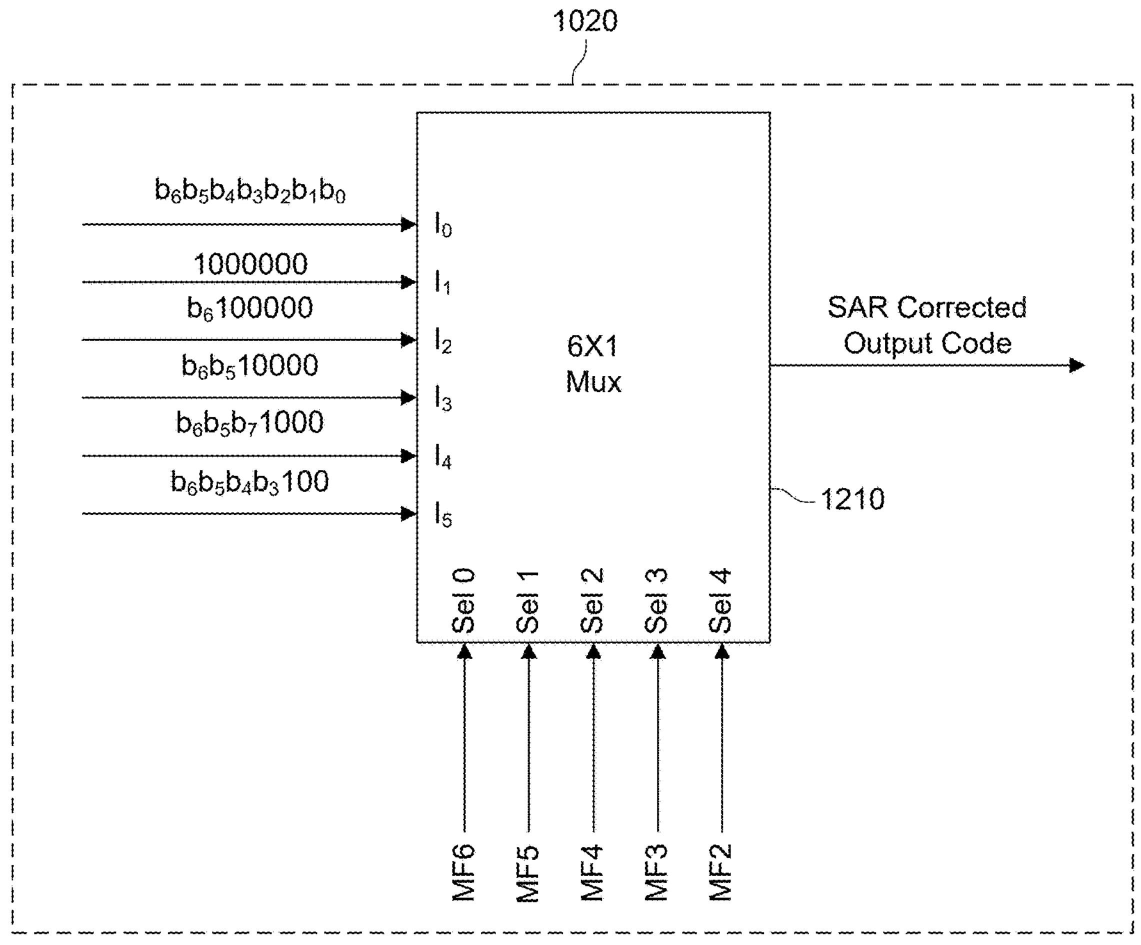
FIG. 12 is a schematic block diagram of a correction block adapted to correct the output code of a SAR when one or more bits of the SAR output code are detected as including error, in accordance with one embodiment of the present disclosure.

FIG. 12 is a block diagram of an error correction circuit 1020 (see FIG. 10) for a 7-bit SAR, the five most significant bits of which are adapted to be monitored for detection and/or correction. Error correction circuit 1020 is shown as including a 6-to-1 multiplexer (mux) 1210 that has 6 data input terminals $I_0$, $I_1$, $I_2$, $I_3$, $I_4$, $I_5$ and 5 select terminals receiving detection signals MF6, MF5, MF4, MF3 and MF2 that are the output signals of the detection circuit for bits 6-2 respectively, as described above.

If MF6, MF5, MF4, MF3, MF2 are all at logic 0 levels, then no error is detected, therefore the output code of the SAR is set to the 7 bits generated by the SAR's comparator and stored in the associated output register (see, for example, comparator 104 and register 106 shown in FIG.

10), referred to herein as $b_6$, $b_5$, $b_4$, $b_3$, $b_2$, $b_1$, $b_0$, where $b_6$ represents the MSB, and $b_0$ represents the LSB of the code stored in the register.

If MF6 is detected as being at a logic 1, then the output of the SAR is set to 1000000, notwithstanding the logic level of the remaining detection signals MF5, MF4, MF3, and MF2; in other words the remaining detection signals are treated as don't care levels if MF6 is at a logic 1. If MF6 is detected as being at a logic 0 and MF5 is detected as being at a logic 1, then the output of the SAR is set to $b_6$100000, notwithstanding the logic levels of the remaining detection signals MF4, MF3, and MF2.

Figures 13, 14A:
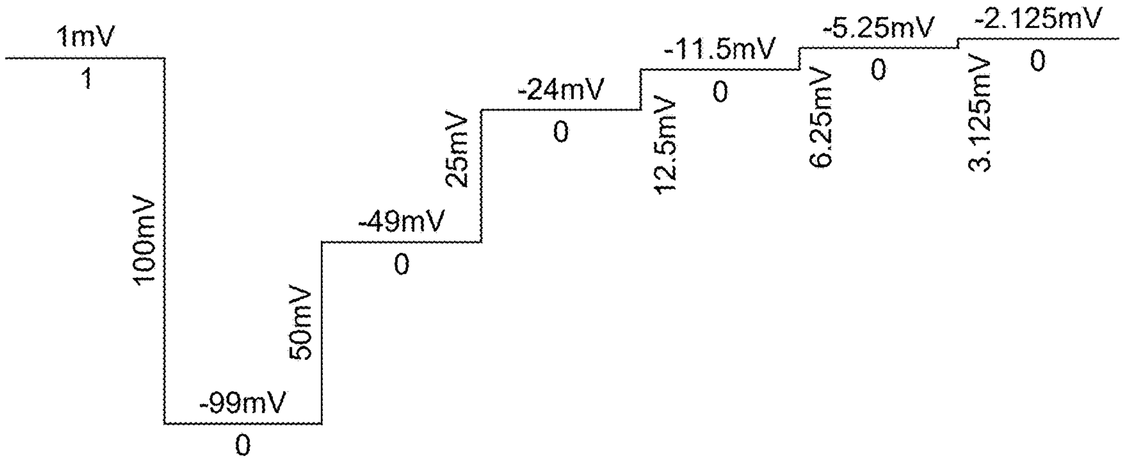
FIG. 13 shows a Table I indicating a SAR's corrected output code for various detected error bits, in accordance with one embodiment of the present disclosure.
FIG. 14A shows an example of the output code of a 7-bit SAR when no metastability is present.

If MF6 and MF5 are detected as being at logic 0 and MF4 is detected as being at a logic 1, then the output of the SAR is set to $b_6b_5$10000, notwithstanding the logic levels of the remaining detection signals MF3, and MF2. If MF6, MF5 and MF4 are detected as being at logic 0, and MF3 is detected as being at a logic 1, then the output of the SAR is set to $b_6b_5b_4$100, notwithstanding the logic level of the remaining detection signal MF2. If MF6, MF5, MF4, and MF3 are detected as being at logic 0, and MF2 is detected as being at a logic 1, then the output of the SAR is set to $b_6b_5b_4b_3$100. FIG. 13 includes s a Table I showing the SAR corrected output code for different logic levels of MF6, MF5, MF4, MF3, MF2 as described above. The third column of the table (titled "Initial Error") shows the LSB error in the output code of the SAR without any correction. The fourth column of the table (titled "Expected Error") shows the LSB error in the output code of the SAR after the correction in accordance with embodiments of the present disclosure. As is seen from the fourth column of Table I, following the correction, the expected error at the output of the SAR is 1 LSB irrespective of the bit position of the detection signal.

Figure 14B:
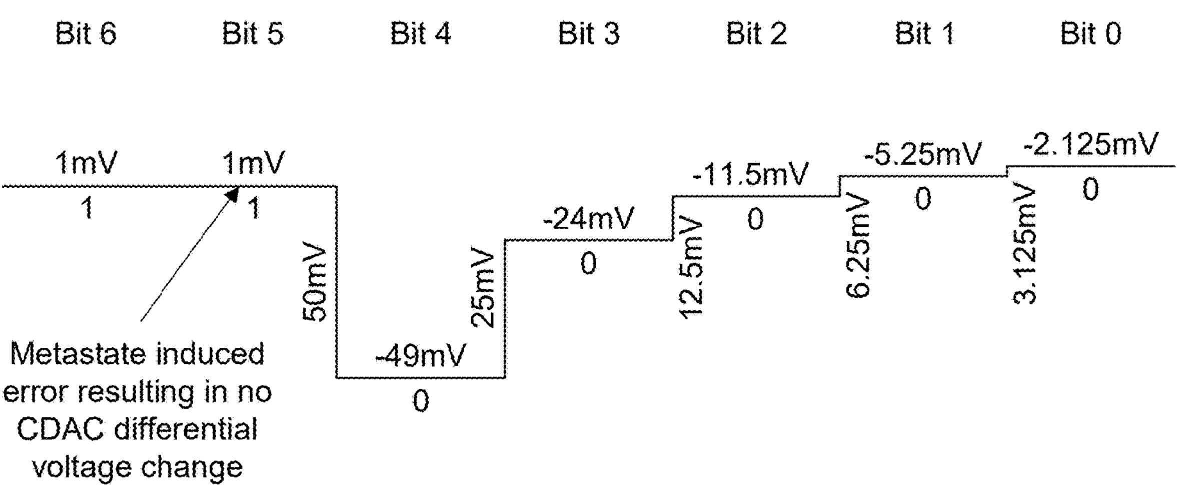
FIG. 14B shows an example of the output code of the 7-bit SAR when due to metastability, an error is detected in the SAR output code.

FIG. 14A shows an example of the output code of a 7-bit SAR when no metastability is present. The SAR is shown to have generated the correct code of 1000000 (decimal 64). FIG. 14B shows an example of the output code of the 7-bit SAR of FIG. 14A when due to metastability, the SAR generates an output code of 110000 (decimal 96). Because both signals CDACP and CDACN during the conversion of bit 6 are detected as having the same value, as seen by the lack of voltage step change during the conversion of bit 6, detection signal MF6 is set to 1 during this cycle. Therefore, in accordance with Table I shown in FIG. 13, the SAR output is set to 1000000 (decimal 64) resulting in a 0 LSB error.

Figure 15A:
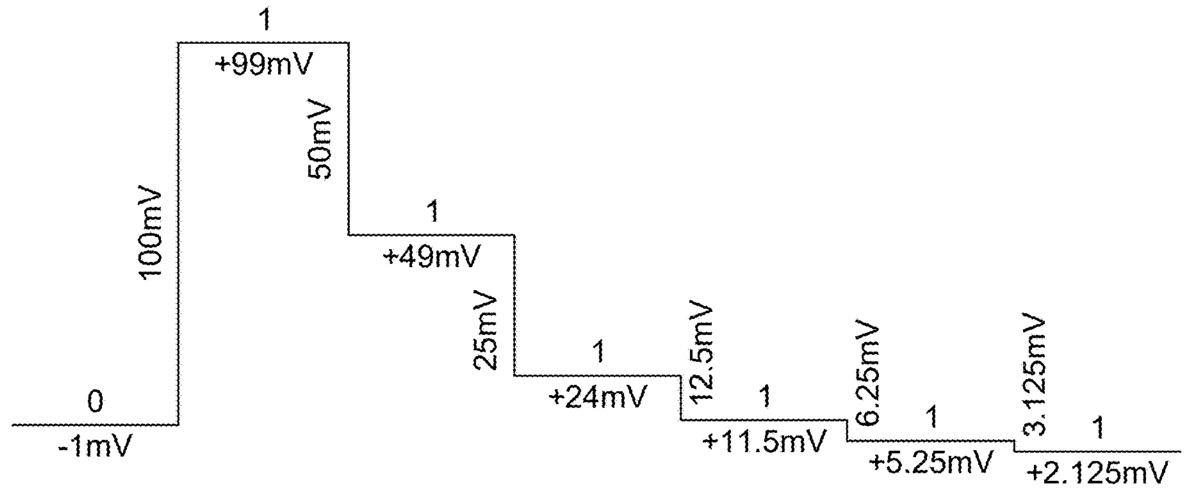
FIG. 15A shows another example of the output code of a 7-bit SAR when no metastability is present.
Figure 15B:
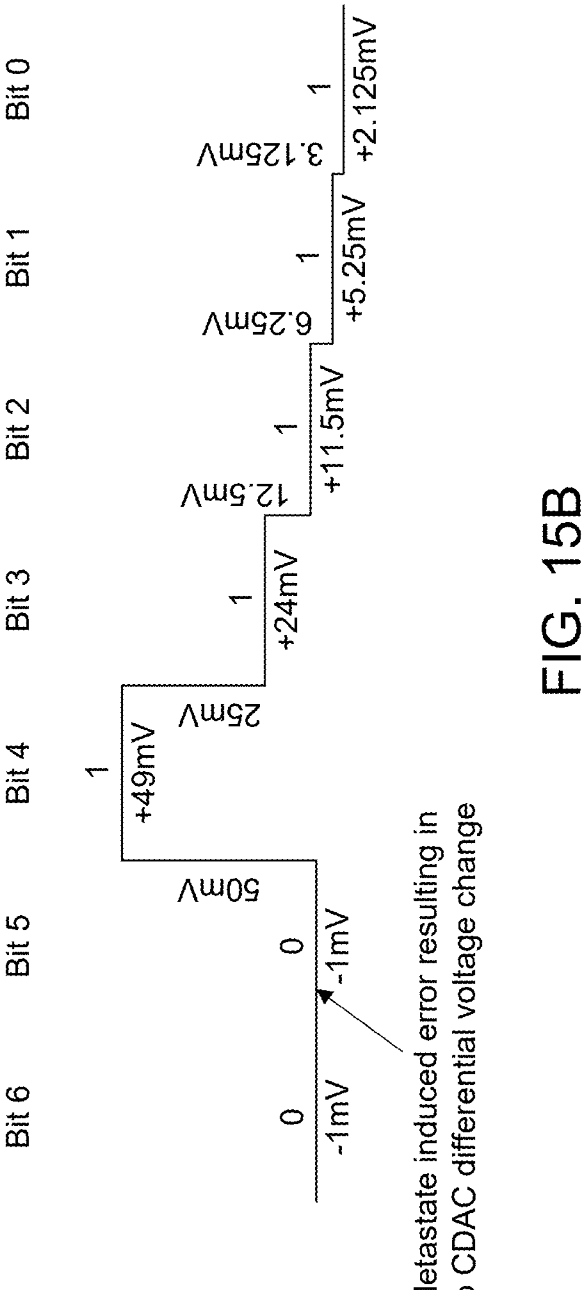
FIG. 15B shows an example of the output code of the 7-bit SAR of FIG. 15A when due to metastability, an error is detected in the SAR output code.

FIG. 15A shows another example of the output code of a 7-bit SAR when no metastability is present. The SAR is shown to have generated the correct code of 0100000 (decimal 63). FIG. 15B shows an example of the output code of the 7-bit SAR of FIG. 15A when due to metastability, the SAR generates an output code of 001111 (decimal 32). Because both signals CDACP and CDACN during the conversion of bit 6 are detected as having the same value, as seen by the lack of voltage step change during the conversion of bit 6, detection signal MF6 is set to 1 during this cycle. Therefore, in accordance with Table I shown in FIG. 13, the SAR output is set to 1000000 (decimal 64) resulting in a 1 LSB error.

An N-bit successive approximation register (SAR) configured to convert an analog signal to a digital signal, in accordance with one embodiment of the present disclosure, includes, in part, a differential comparator adapted to receive a pair of differential input signals and generate a pair of differential comparator output signals; an N-bit register adapted to store the differential comparator output signals; a capacitive DAC adapted to supply a pair of differential feedback signals to the differential comparator in response to the signals stored in the N-bit register; and M detection circuits each associated with a different one of M most significant bits of the N-bit register. Each detection circuit further includes, in part, a PMOS transistor adapted to precharge a first node to a supply voltage; a first NMOS transistor having a drain terminal coupled to the first node, and a gate terminal adapted to receive a first voltage representative of a first one of the pair of differential feedback signals; a second NMOS transistor having a drain terminal coupled to a source terminal of the first NMOS transistor, a gate terminal adapted to receive a second voltage representative of a second one of the pair of differential feedback signals, and a source terminal coupled to a ground terminal; and a latch coupled to the first node and adapted to store the first node's voltage after the first and second voltages are applied respectively to the gate terminals of the first and second NMOS transistors. N is an integer greater than 1 and M is an integer equal to or smaller than N.

The SAR, in accordance with one embodiment of the present disclosure, includes, in part, a correction circuit configured to set bit N of an output of the SAR to a logic 1, and set the remaining (N−1) output bits of the SAR to logic 0 if a signal representative of an output of the latch associated with bit N is set to a first logic state.

In one embodiment, the correction circuit is further configured to set bit (N−1) of the output of the SAR to a logic 1, and set the remaining (N−2) output bits of the SAR to logic 0 if the signal representative of an output of the latch associated with bit (N−1) is set to the first logic state.

In one embodiment, the correction circuit is further configured to set bit (N−2) of the output of the SAR to a logic 1, and set the remaining (N−3) output bits of the SAR to logic 0 if the signal representative of an output of the latch associated with bit (N−2) is set to the first logic state. The SAR, in accordance with one embodiment of the present disclosure, includes, in part, a signal sampler adapted to supply the pair of differential input signals in response to a pair of received differential signals.

In one embodiment, the differential comparator includes, in part, a first chain of inverters adapted to supply a first one of the pair of differential comparator output signals; and a second chain of inverters adapted to supply a second one of the pair of differential comparator output signals. The SAR, in accordance with one embodiment of the present disclosure, includes, in part, one or more inverters coupled to an output of the latch associated with each of the M most significant bits of the N-bit register.

A method of detecting an error in an N-bit successive approximation register (SAR) configured to convert an analog signal to a digital signal, in accordance with one embodiment of the present disclosure, includes in part, generating a pair of differential output signals in response to comparing a pair of differential input signals received by a comparator during each of N conversion cycles; storing the N pairs of differential output signals in an N-bit register; supplying a pair of differential feedback signals, defined by the signals stored in the N-bit register, to the comparator during each of the N conversion cycles; and for each of M most significant bits of the N-bit register: precharging a first node to a supply voltage using a PMOS transistor; applying a first voltage representative of a first one of the pair of differential feedback signals to a gate terminal of a first NMOS transistor having a drain terminal coupled to the first node; applying a second voltage representative of a second one of the pair of differential feedback signals to a gate terminal of a second NMOS transistor having a drain terminal coupled to a source terminal of the first NMOS transistor, and a source terminal coupled to a ground terminal; and latching a voltage of the first node, wherein the latched voltage represents an error if the latched voltage is at a first logic state, and wherein N is an integer greater than 1 and M is an integer equal to or smaller than N.

The method, in accordance with one embodiment of the present disclosure, further includes, in part, setting bit N of an output of the SAR to a logic 1, and setting the remaining (N−1) output bits of the SAR to logic 0 if the latched voltage associated with bit N is at the first logic state. The method, in accordance with one embodiment of the present disclosure, further includes, in part: setting bit (N−1) of the output of the SAR to a logic 1, and setting the remaining (N−2) output bits of the SAR to logic 0, if the latched voltage associated with bit (N−1) is at the first logic state. The method, in accordance with one embodiment of the present disclosure, further includes, in part, setting bit (N−2) of the output of the SAR to a logic 1, and setting the remaining (N−3) output bits of the SAR to logic 0 if the latched voltage associated with bit (N−2) is at the first logic state.

The method, in accordance with one embodiment of the present disclosure, further includes, in part, supplying the pair of differential input signals in response to sampling a pair of received differential signals. The method, in accordance with one embodiment of the present disclosure, further includes, in part, supplying a first one of the pair of differential output signals via a first chain of inverter; and supplying a second one of the pair of differential output signals via a second chain of inverter. The method, in accordance with one embodiment of the present disclosure, further includes, in part, applying the latched output voltage associated with each of the M most significant bits to one or more inverters.

A non-transitory computer readable medium includes stored instructions, which when executed by a processor, cause the processor to generate data representative of an N-bit successive approximation register (SAR) configured to convert an analog signal to a digital signal. The SAR includes, in part, a differential comparator adapted to receive a pair of differential input signals and generate a pair of differential comparator output signals; an N-bit register adapted to store the differential comparator output signals; a capacitive DAC adapted to supply a pair of differential feedback signals to the differential comparator in response to the signals stored in the N-bit register; and M detection circuits each associated with a different one of M most significant bits of the N-bit register. Dach detection circuit further includes, in part, a PMOS transistor adapted to precharge a first node to a supply voltage; a first NMOS transistor having a drain terminal coupled to the first node, and a gate terminal adapted to receive a first voltage representative of a first one of the pair of differential feedback signals; a second NMOS transistor having a drain terminal coupled to a source terminal of the first NMOS transistor, a gate terminal adapted to receive a second voltage representative of a second one of the pair of differential feedback signals; and a source terminal coupled to a ground terminal; and a latch coupled to the first node and adapted to store the first node's voltage after the first and second voltages are applied respectively to the gate terminals of the first and second NMOS transistors, wherein N is an integer greater than 1 and M is an integer equal to or smaller than N.

In one embodiment, the instructions further cause the processor to generate data representative of a correction circuit configured to set bit N of an output of the SAR to a logic 1, and set the remaining (N−1) output bits of the SAR to logic 0 if a signal representative of an output of the latch associated with bit N is set to a first logic state. In one embodiment, the correction circuit is further configured to set bit (N−1) of the output of the SAR to a logic 1, and set the remaining (N−2) output bits of the SAR to logic 0 if the signal representative of an output of the latch associated with bit (N−1) is set to the first logic state In one embodiment, the correction circuit is further configured to set bit (N−2) of the output of the SAR to a logic 1, and set the remaining (N−3) output bits of the SAR to logic 0 if the signal representative of an output of the latch associated with bit (N−2) is set to the first logic state. In one embodiment, the instructions further cause the processor to generate data representative of a signal sampler adapted to supply the pair of differential input signals in response to a pair of received differential signals. In one embodiment, the instructions further cause the processor to generate data representative of a first chain of inverters adapted to supply a first one of the pair of differential comparator output signals; and a second chain of inverters adapted to supply a second one of the pair of differential comparator output signals.

Figure 16:
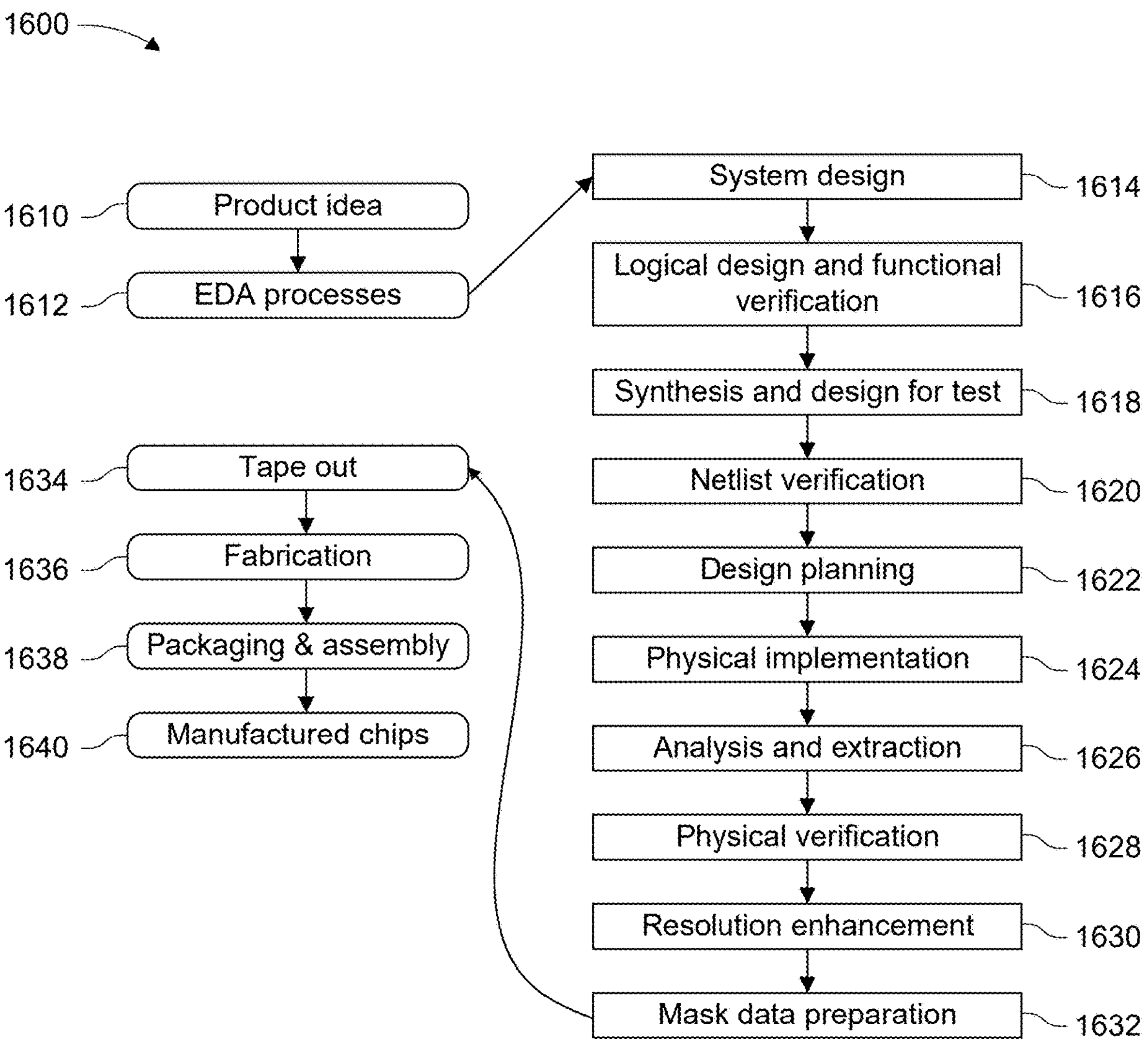
FIG. 16 depicts a flowchart of various processes used during the design and manufacturing of an integrated circuit in accordance with some embodiments of the present disclosure.

FIG. 16 illustrates an example set of processes 1600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1610 with information supplied by a designer, information which is transformed to create an article of manufacture that uses a set of EDA processes 1612. When the design is finalized, the design is taped-out 1634, which is when artwork (e.g., geometric patterns) for the integrated circuit is sent to a fabrication facility to manufacture the mask set, which is then used to manufacture the integrated circuit. After tape-out, a semiconductor die is fabricated 1636 and packaging and assembly processes 1636 are performed to produce the finished integrated circuit 1640.

Specifications for a circuit or electronic structure may range from low-level transistor material layouts to high-level description languages. A high-level description may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 16. The processes described by be enabled by EDA products (or tools).

During system design 1614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1620, the netlist is checked for compliance with timing constraints and for correspondence with the HDL code. During design planning 1622, an overall floor plan for the integrated circuit is constructed and analyzed for timing and top-level routing.

During layout or physical implementation 1624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1626, the circuit function is verified at the layout level, which permits refinement of the layout design. During physical verification 1628, the layout design is checked to ensure that manufacturing constraints are correct, such as DRC constraints, electrical constraints, lithographic constraints, and that circuitry function matches the HDL design specification. During resolution enhancement 1630, the geometry of the layout is transformed to improve how the circuit design is manufactured.

During tape-out, data is created to be used (after lithographic enhancements are applied if appropriate) for production of lithography masks. During mask data preparation 1632, the 'tape-out' data is used to produce lithography masks that are used to produce finished integrated circuits.

A storage subsystem of a computer system (such as computer system 1600 of FIG. 20) may be used to store the programs and data structures that are used by some or all of the EDA products described herein, and products used for development of cells for the library and for physical and logical design that use the library.

Figure 17:
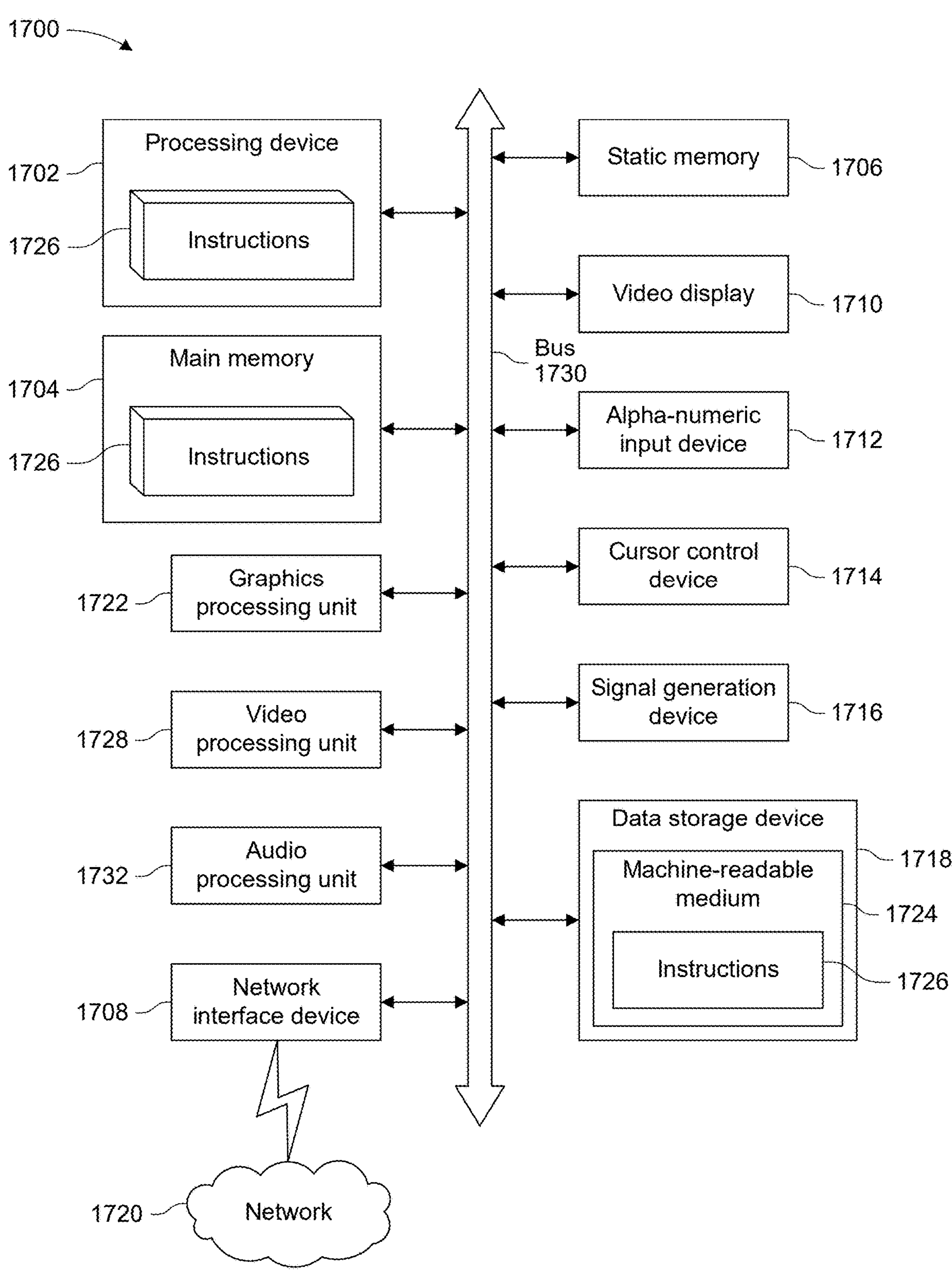
FIG. 17 is an example of a computer system in which embodiments of the present disclosure may operate.

FIG. 17 illustrates an example machine of a computer system 1700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1700 includes a processing device 1702, a main memory 1704 (e.g., read-only memory (ROM), flash memory, dynamic random access memory (DRAM) such as synchronous DRAM (SDRAM), a static memory 1706 (e.g., flash memory, static random access memory (SRAM), etc.), and a data storage device 1718, which communicate with each other via a bus 1730.

Processing device 1702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1702 may also be one or more special-purpose processing devices such as an application specific integrated circuit (ASIC), a field programmable gate array (FPGA), a digital signal processor (DSP), network processor, or the like. The processing device 1702 may be configured to execute instructions 1726 for performing the operations and steps described herein.

The computer system 1700 may further include a network interface device 1708 to communicate over the network 1720. The computer system 1700 also may include a video display unit 1710 (e.g., a liquid crystal display (LCD) or a cathode ray tube (CRT)), an alphanumeric input device 1712 (e.g., a keyboard), a cursor control device 1714 (e.g., a mouse), a graphics processing unit 1722, a signal generation device 1716 (e.g., a speaker), graphics processing unit 1722, video processing unit 1728, and audio processing unit 1732.

The data storage device 1718 may include a machine-readable storage medium 1724 (also known as a non-transitory computer-readable medium) on which is stored one or more sets of instructions 1726 or software embodying any one or more of the methodologies or functions described herein. The instructions 1726 may also reside, completely or at least partially, within the main memory 1704 and/or within the processing device 1702 during execution thereof by the computer system 1700, the main memory 1704 and the processing device 1702 also constituting machine-readable storage media.

In some implementations, the instructions 1726 include instructions to implement functionality corresponding to the present disclosure. While the machine-readable storage medium 1724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

What is claimed:

1. An N-bit successive approximation register (SAR) configured to convert an analog signal to a digital signal, the SAR comprising:

a differential comparator adapted to receive a pair of differential input signals and generate a pair of differential comparator output signals;

an N-bit register adapted to store the differential comparator output signals;

a capacitive digital-to-analog converter (DAC) adapted to supply a pair of differential feedback signals to the differential comparator in response to the signals stored in the N-bit register; and M detection circuits each associated with a different one of M most significant bits of the N-bit register, each detection circuit comprising:

a PMOS transistor adapted to precharge a first node to a supply voltage;

a first NMOS transistor having a drain terminal coupled to the first node, and a gate terminal adapted to receive a first voltage representative of a first one of the pair of differential feedback signals;

a second NMOS transistor having a drain terminal coupled to a source terminal of the first NMOS transistor, a gate terminal adapted to receive a second voltage representative of a second one of the pair of differential feedback signals, and a source terminal coupled to a ground terminal; and a latch coupled to the first node and adapted to store the first node's voltage after the first and second voltages are applied respectively to the gate terminals of the first and second NMOS transistors, wherein N is an integer greater than 1 and M is an integer equal to or smaller than N.

2. The SAR of claim 1 further comprising:

a correction circuit configured to set bit N of an output of the SAR to a logic 1, and set the remaining (N−1) output bits of the SAR to logic 0 if a signal representative of an output of the latch associated with bit N is set to a first logic state.

3. The SAR of claim 2 wherein the correction circuit is further configured to set bit (N−1) of the output of the SAR to a logic 1, and set the remaining (N−2) output bits of the SAR to logic 0 if the signal representative of an output of the latch associated with bit (N−1) is set to the first logic state.

4. The SAR of claim 3 wherein the correction circuit is further configured to set bit (N−2) of the output of the SAR to a logic 1, and set the remaining (N−3) output bits of the SAR to logic 0 if the signal representative of an output of the latch associated with bit (N−2) is set to the first logic state.

5. The SAR of claim 4 further comprising:

a signal sampler adapted to supply the pair of differential input signals in response to a pair of received differential signals.

6. The SAR of claim 5 wherein the differential comparator comprises:

a first chain of inverters adapted to supply a first one of the pair of differential comparator output signals; and a second chain of inverters adapted to supply a second one of the pair of differential comparator output signals.

7. The SAR of claim 6 further comprising:

one or more inverters coupled to an output of the latch associated with each of the M most significant bits of the N-bit register.

8. A method of detecting an error in an N-bit successive approximation register (SAR) configured to convert an analog signal to a digital signal, the method comprising:

generating a pair of differential output signals in response to comparing a pair of differential input signals received by a comparator during each of N conversion cycles;

storing the N pairs of differential output signals in an N-bit register;

supplying a pair of differential feedback signals, defined by the signals stored in the N-bit register, to the comparator during each of the N conversion cycles; and for each of M most significant bits of the N-bit register, precharging a first node to a supply voltage using a PMOS transistor;

applying a first voltage representative of a first one of the pair of differential feedback signals to a gate terminal of a first NMOS transistor having a drain terminal coupled to the first node;

applying a second voltage representative of a second one of the pair of differential feedback signals to a gate terminal of a second NMOS transistor having a drain terminal coupled to a source terminal of the first NMOS transistor, and a source terminal coupled to a ground terminal; and latching a voltage of the first node, wherein the latched voltage represents an error if the latched voltage is at a first logic state, and wherein N is an integer greater than 1 and M is an integer equal to or smaller than N.

9. The method of claim 8 further comprising:

setting bit N of an output of the SAR to a logic 1, and setting the remaining (N−1) output bits of the SAR to logic 0 if the latched voltage associated with bit N is at the first logic state.

10. The method of claim 9 further comprising:

setting bit (N−1) of the output of the SAR to a logic 1, and setting the remaining (N−2) output bits of the SAR to logic 0, if the latched voltage associated with bit (N−1) is at the first logic state.

11. The method of claim 10 further comprising:

setting bit (N−2) of the output of the SAR to a logic 1, and setting the remaining (N−3) output bits of the SAR to logic 0 if the latched voltage associated with bit (N−2) is at the first logic state.

12. The method of claim 11 further comprising:

supplying the pair of differential input signals in response to sampling a pair of received differential signals.

13. The method of claim 12 further comprising:

supplying a first one of the pair of differential output signals via a first chain of inverter; and supplying a second one of the pair of differential output signals via a second chain of inverter.

14. The method of claim 13 further comprising:

applying the latched output voltage associated with each of the M most significant bits to one or more inverters.

15. A non-transitory computer readable medium comprising stored instructions, which when executed by a processor, cause the processor to generate data representative of an N-bit successive approximation register (SAR) configured to convert an analog signal to a digital signal, the SAR comprising:

a differential comparator adapted to receive a pair of differential input signals and generate a pair of differential comparator output signals;

an N-bit register adapted to store the differential comparator output signals;

a capacitive DAC adapted to supply a pair of differential feedback signals to the differential comparator in response to the signals stored in the N-bit register; and M detection circuits each associated with a different one of M most significant bits of the N-bit register, each detection circuit comprising:

a PMOS transistor adapted to precharge a first node to a supply voltage;

a first NMOS transistor having a drain terminal coupled to the first node, and a gate terminal adapted to receive a first voltage representative of a first one of the pair of differential feedback signals;

a second NMOS transistor having a drain terminal coupled to a source terminal of the first NMOS transistor, a gate terminal adapted to receive a second voltage representative of a second one of the pair of differential feedback signals; and a source terminal coupled to a ground terminal; and a latch coupled to the first node and adapted to store the first node's voltage after the first and second voltages are applied respectively to the gate terminals of the first and second NMOS transistors, wherein N is an integer greater than 1 and M is an integer equal to or smaller than N.

16. The non-transitory computer readable medium of claim 15, wherein the instructions further cause the processor to generate data representative of:

a correction circuit configured to set bit N of an output of the SAR to a logic 1, and set the remaining (N−1) output bits of the SAR to logic 0 if a signal representative of an output of the latch associated with bit N is set to a first logic state.

17. The non-transitory computer readable medium of claim 16, wherein the correction circuit is further configured to set bit (N−1) of the output of the SAR to a logic 1, and set the remaining (N−2) output bits of the SAR to logic 0 if the signal representative of an output of the latch associated with bit (N−1) is set to the first logic state.

18. The non-transitory computer readable medium of claim 17, wherein the correction circuit is further configured to set bit (N−2) of the output of the SAR to a logic 1, and set the remaining (N−3) output bits of the SAR to logic 0 if the signal representative of an output of the latch associated with bit (N−2) is set to the first logic state.

19. The non-transitory computer readable medium of claim 18, wherein the instructions further cause the processor to generate data representative of:

a signal sampler adapted to supply the pair of differential input signals in response to a pair of received differential signals.

20. The non-transitory computer readable medium of claim 19, wherein the instructions further cause the processor to generate data representative of:

a first chain of inverters adapted to supply a first one of the pair of differential comparator output signals; and a second chain of inverters adapted to supply a second one of the pair of differential comparator output signals.

* * * * *